(12) United States Patent
Chiang

(10) Patent No.: US 8,779,993 B2
(45) Date of Patent: Jul. 15, 2014

(54) HOUSING, ELECTRONIC DEVICE USING THE SAME AND METHOD FOR MAKING THE SAME

(75) Inventor: Chwan-Hwa Chiang, New Taipei (TW)

(73) Assignee: FIH (Hong Kong) Limited, Kowloon (HK)

( * ) Notice: Subject to any disclaimer, the term of this patent is extended or adjusted under 35 U.S.C. 154(b) by 135 days.

(21) Appl. No.: 13/371,623

(22) Filed: Feb. 13, 2012

(65) Prior Publication Data

US 2013/0082885 A1 Apr. 4, 2013

(30) Foreign Application Priority Data

Sep. 30, 2011 (CN) .......................... 2011 1 0291782

(51) Int. Cl.
*H01Q 1/24* (2006.01)
*B29C 70/08* (2006.01)
*B32B 27/12* (2006.01)

(52) U.S. Cl.
USPC .................. 343/702; 428/300.4; 156/243

(58) Field of Classification Search
USPC .......................................... 343/702
See application file for complete search history.

(56) References Cited

U.S. PATENT DOCUMENTS

2006/0110599 A1* 5/2006 Honma et al. ................. 428/413
2006/0263626 A1* 11/2006 Kloss ............................ 428/650

* cited by examiner

*Primary Examiner* — Jerome Jackson, Jr.
*Assistant Examiner* — Andrea Lindgren Baltzel
(74) *Attorney, Agent, or Firm* — Novak Druce Connolly Bove + Quigg LLP

(57) ABSTRACT

A housing includes a base layer and a decorative layer formed on the base layer. The base layer includes a first portion and a second portion joining with the first portion. The first portion and the second portion cooperatively form an outer surface of the base layer. The first portion is composed of hardened carbon fiber woven fabric impregnated with resin. The second portion is composed of hardened glass fiber woven fabric impregnated with resin. The decorative layer formed on the outer surface. A method for making the housing and an electronic device using the device housing are provided.

17 Claims, 5 Drawing Sheets

HOUSING, ELECTRONIC DEVICE USING THE SAME AND METHOD FOR MAKING THE SAME

BACKGROUND

1. Technical Field

The present disclosure relates to a housing for electronic device and a method for making the housing.

2. Description of Related Art

Shells for portable electronic devices are usually made of plastic or metal. Although plastic shells can be formed at one time by injection molding, they are not very strong and are not very resistant to abrasion. In contrast, metal shells are stronger and have greater abrasion resistance, but are electrically conductive, which may weaken the communication signals.

Therefore, there is room for improvement within the art.

BRIEF DESCRIPTION OF THE DRAWINGS

Many aspects of the disclosure can be better understood with reference to the drawing. The components in the drawing are not necessarily drawn to scale, the emphasis instead being placed upon clearly illustrating the principles of the disclosure. Moreover, in the drawings like reference numerals designate corresponding parts throughout the views.

DETAILED DESCRIPTION

Figure 1:
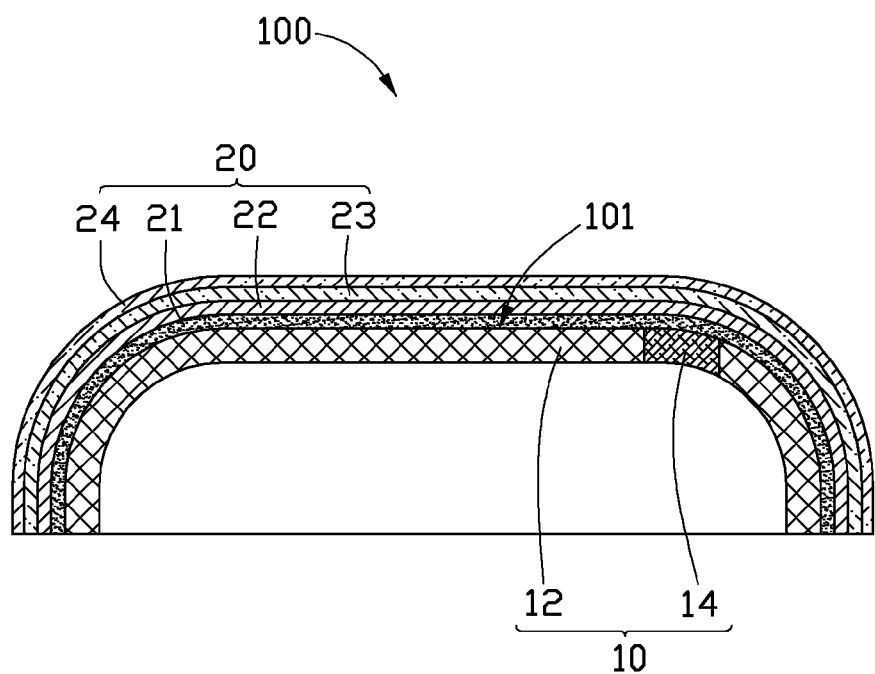
FIG. 1 is a schematic cross-sectional view of an exemplary embodiment of a housing.

FIG. 1 shows an exemplary housing 100. The housing 100 includes a base layer 10 and a decorative layer 20 bonding the base layer 10. The base layer 10 includes a first portion 12 and a second portion 14 joining with the first portion 12. The first portion 12 and the second portion 14 cooperatively form an outer surface 101 of the base layer 10. The first portion 12 and the second portion 14 both are composed of hardened fiber woven fabric impregnated with resin. The first portion 12 and the second portion 14 are integrally joined together by the resin. The fiber woven fabric for the first portion 12 may be carbon fiber which has a light weight, sufficient strength, and good impact resistance. The fiber woven fabric for the second portion 14 may be glass fiber which is not electrically conductive.

The resin impregnating in the first portion 12 and the second portion 14 may be at least translucent and optionally transparent, such as epoxy resin, polycarbonate, mixture of polyamide resin and glass fiber, or any combination thereof. In one embodiment, transparent epoxy resin is selected. The resin improves the hardness of the base layer 10 and provides a smooth outer surface for the base layer 10.

The decorative layer 20 is formed on the outer surface 101 and may include a base paint layer 21 attached to the outer surface 101, a metallic coating 22 attached to the base paint layer 21, a middle paint layer 23 attached to the metallic coating 22, and a top paint layer 24 attached to the middle paint layer 23.

The base paint layer 21 may be ultraviolet curable paint. The base paint layer 21 further smoothes the outer surface 101 of the base layer 10, improving the bonding between the base layer 10 and coatings subsequently formed thereon.

Though coating 22 is metallic, it is not conductive. The metallic coating 22 is made non-conductive by creating a very thin and discontinuous coating. Such coatings are commonly made by non-conductive vacuum metallization, such as magnetic sputtering or vacuum evaporation. The metallic coating 22 may be made of a material selected from a group consisting of tin, aluminum, stainless steel, titanium, compound of silicon and aluminum, and any combination thereof. The metallic coating 22 provides a metallic appearance for the housing 100.

The middle paint layer 23 is made of a colored paint and provides a desired color for the housing 100.

The top paint layer 24 may be made of transparent paint, such as varnish, protecting the underlying coatings from scratch.

The base paint layer 21, metallic coating 22, and the middle paint layer 23 are preferably transparent, ensuring the woven pattern of the fiber woven fabric for the base layer 10 visible to the users.

Figure 2:
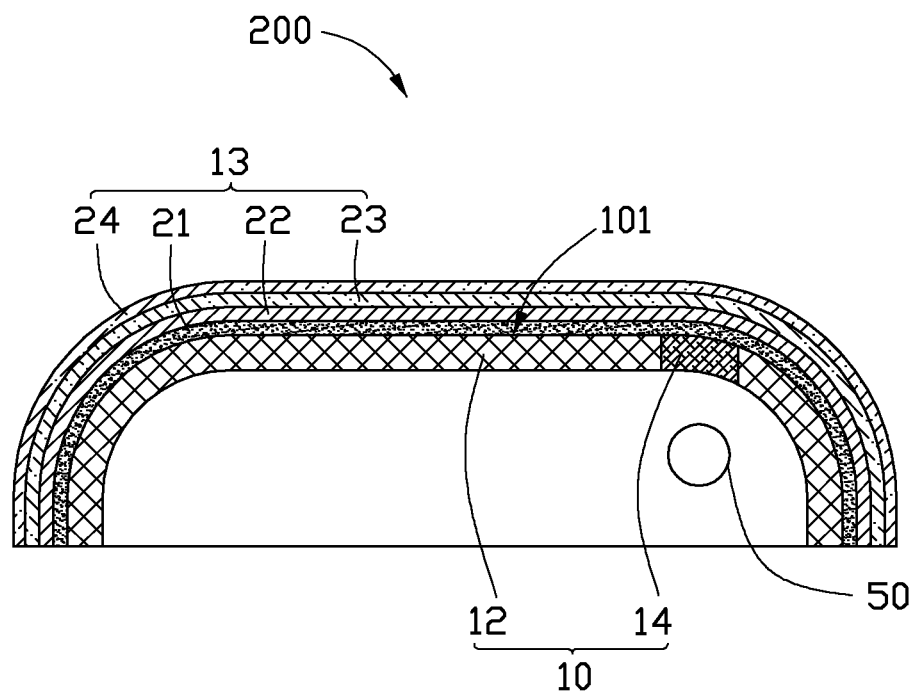
FIG. 2 is a schematic cross-sectional view of an exemplary embodiment of an electronic device using the housing shown in FIG. 1.

Referring to the FIG. 2, the housing 100 can be used for an electronic device 200 (such as a mobile phone) having a radio signal sending/receiving member 50 (schematically shown), such an antenna. The electronic device 200 includes the housing 100 and the radio signal sending/receiving member 50. The second portion 14 may be aligned above the radio signal sending/receiving member 50 received inside the housing 100 to ensure an effective telecommunication of the radio signal sending/receiving member 50.

The metallic coating 22 and the middle paint layer may be omitted.

A method for making the housing 100 may include the following steps.

Figure 3:
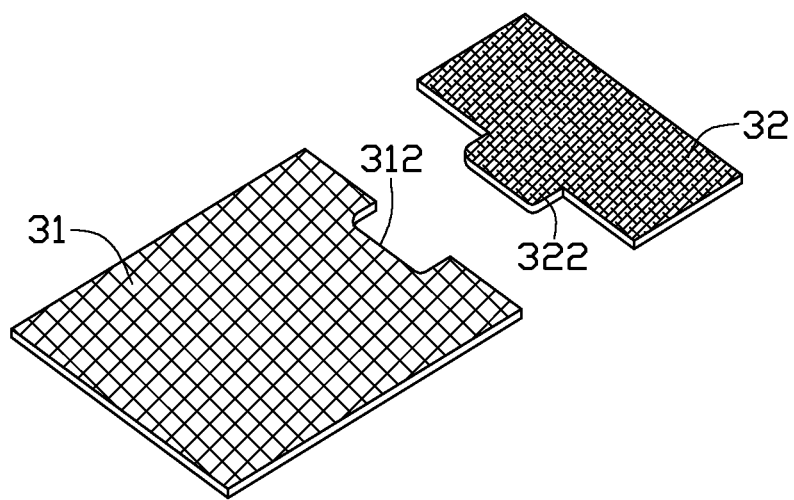
FIG. 3 is a schematic view showing a manufacturing process of proving a first fabric sheet and a second fabric sheet in the method of manufacturing the housing according to an exemplary embodiment.

Referring to FIG. 3, a first fabric sheet 31 and a second fabric sheet 32 both impregnated with resin are provided. The first fabric sheet 31 is woven with carbon fiber. The second fabric sheet 32 is woven with glass fiber. The resin may be a at least translucent resin selected from a group consisting of epoxy resin, polycarbonate, mixture of polyamide resin and glass fiber, or any combination thereof. In one embodiment, epoxy resin is selected. The first fabric sheet 31 has a first periphery 312. The second fabric sheet 32 has a second periphery 322 meshing with the first periphery 312.

Figure 4:
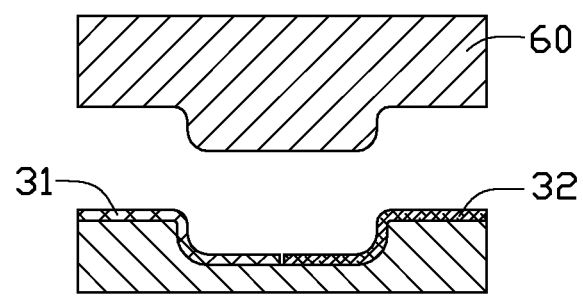
FIG. 4 is a schematic view showing a manufacturing process of placing the first fabric sheet and a second fabric sheet in a hot-pressing mold in the method of manufacturing the housing according to an exemplary embodiment.

Referring FIG. 4, the first fabric sheet 31 and the second fabric sheet 32 are placed in a hot-pressing mold 60, with the first periphery 312 meshing with the second periphery 322.

The first fabric sheet 31 and the second fabric sheet 32 are hot-pressed using the hot-pressing mold 60, performing a desired three-dimensional shape. During the hot-pressing process, the hot-pressing mold may be heated to a temperature of about 100 degrees centigrade (° C.) to about 250° C. A pressing pressure of about 10 kilogram per square centimeter ($kg/cm^2$) to about 180 $kg/cm^2$ is applied to the first fabric sheet 31 and the second fabric sheet 32 via the hot-pressing mold. The hot-pressing process may take about 20 minutes (min) to about 60 min. When the resin is hardened, the first fabric sheet 31 and the second fabric sheet 32 are integrally joined together by the resin, achieving a three-dimensional shaped preliminary member (not shown).

Figure 5:
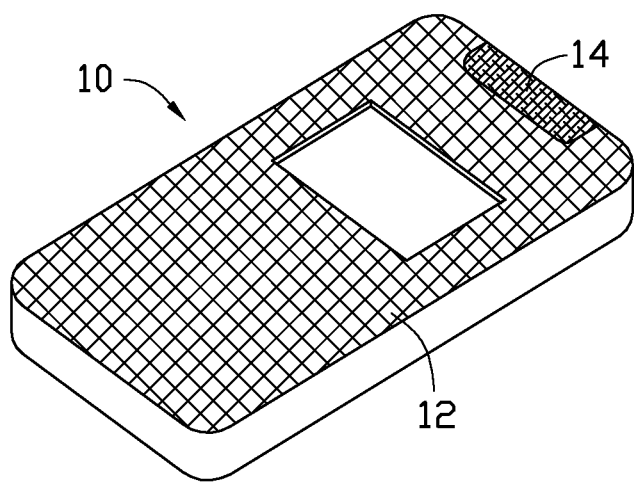
FIG. 5 is a schematic view showing a substrate obtained after a cutting process in the method of manufacturing the housing according to an exemplary embodiment.

Referring to FIG. 5, the preliminary member is trimmed, removing excess material of the preliminary and achieving the base layer 10. The base layer 10 includes the first portion 12, the second portion 14, and the outer surface 101. The first portion 12 is formed by the hardened first fabric sheet 31 and the second portion 14 is formed by the hardened second fabric sheet 32.

The decorative layer 20 is then formed on the outer surface 101. Forming the decorative layer 20 may include forming the base paint layer 21 on the outer surface 101 by spraying, for example. The metallic coating 22 is then formed on the base paint layer 21 by non-conductive vacuum metallization, such as magnetic sputtering or vacuum evaporation, using a target material selected from a group consisting of tin, aluminum, stainless steel, titanium, compound of silicon and aluminum, and any combination thereof. The middle paint layer 23 is formed on the metallic coating 22 by spraying, for example. Then, the top paint layer 24 is formed on the middle paint layer 23 by spraying, for example.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. An electronic device, comprising:
A radio signal sending/receiving member; and
a housing receiving the radio signal sending/receiving member therein, the housing comprising:
a base layer, the base layer including a first portion and a second portion joining with the first portion, the first portion having a first periphery, the second portion having a second periphery, the first periphery meshing with the second periphery, thereby the first portion and the second portion cooperatively forming an outer surface of the base layer, the first portion composed of hardened carbon fiber woven fabric impregnated with a resin, the second portion composed of hardened glass fiber woven fabric impregnated with the resin; and
a decorative layer formed on the outer surface.

2. The housing as claimed in claim 1, wherein the resin is at least translucent.

3. The housing as claimed in claim 2, wherein the resin is epoxy resin.

4. The housing as claimed in claim 2, wherein the resin is selected from polycarbonate or mixture of polyamide resin and glass fiber.

5. The housing as claimed in claim 1, wherein the first portion and the second portion are integrally joined together by the resin.

6. The housing as claimed in claim 1, wherein the decorative layer includes a base paint layer attached to the outer surface, a metallic coating attached to the base paint layer, a middle paint layer attached to the metallic coating, and a transparent top paint layer attached to the middle paint layer.

7. The housing as claimed in claim 6, wherein the metallic coating is thin enough to be discontinuous and non-conductive.

8. The housing as claimed in claim 7, wherein the metallic coating is a material selected from a group consisting of tin, aluminum, stainless steel, titanium, compound of silicon and aluminum, and any combination thereof.

9. The housing as claimed in claim 6, wherein the middle paint layer is made of a colored paint.

10. A method for making a housing for a radio signal sending/receiving member; comprising:
providing a first fabric sheet and a second fabric sheet both impregnated with resin, the first fabric sheet woven by carbon fiber, the second fabric sheet woven by glass fiber, the first fabric sheet having a first periphery, the second fabric sheet having a second periphery meshing with the first periphery;
placing the first fabric sheet and the second fabric sheet together in a hot-pressing mold, with the first periphery meshing with the second periphery;
hot-pressing the first fabric sheet and the second fabric sheet via the hot-pressing mold, thereby joining the first fabric sheet and the second fabric sheet by the resin and achieving a three-dimensional shaped preliminary member;
trimming the preliminary member, removing excess material of the preliminary and achieving a base layer such that the first fabric sheet forming a first portion of the base layer, the second fabric sheet forming a second portion joining with the first portion, the first portion and the second portion cooperatively forming an outer surface of the base layer; and
forming a decorative layer on the base layer; and
placing the housing over a radio signal sending/receiving member.

11. The method as claimed in claim 10, wherein the resin is a at least translucent resin selected from a group consisting of epoxy, polycarbonate, mixture of polyamide resin and glass fiber, or any combination thereof.

12. The method as claimed in claim 10, wherein the hot-pressing is conducted under a temperature of about 100° C. to about 250° C., a pressing pressure of about 10 kg/cm$^2$ to about 180 kg/cm$^2$, a duration of about 20 min to about 60 min.

13. The method as claimed in claim 10, wherein the step of forming the decorative layer includes:
forming a base paint layer on the outer surface;
forming a metallic coating on the base paint layer by non-conductive vacuum metallization, using a target material selected from a group consisting of tin, aluminum, stainless steel, titanium, compound of silicon and aluminum, and any combination thereof;
forming a middle paint layer on the metallic coating, the middle paint layer made of colored paint; and
forming a transparent top paint layer on the middle paint layer.

14. An electronic device, comprising:
radio signal sending/receiving member; and
a housing receiving the radio signal sending/receiving member therein, the housing comprising:
a base layer, the base layer including a first portion and a second portion joining with the first portion, the first portion having a first periphery, the second portion having a second periphery, the first periphery meshing with the second periphery, thereby the first portion and the second portion cooperatively forming an outer surface of the base layer, the first portion composed of hardened carbon fiber woven fabric impregnated with a resin, the second portion composed of hardened glass fiber woven fabric impregnated with the resin, the second portion being aligned above the radio signal sending/receiving member; and
a decorative layer formed on the outer surface.

15. The electronic device as claimed in claim 14, wherein the resin is at least translucent.

16. The electronic device as claimed in claim 15, wherein the resin is epoxy.

17. The electronic device as claimed in claim 14, wherein the first portion and the second portion are integrally joined together by the resin.

* * * * *